US012708028B2

(12) United States Patent
Herzer et al.

(10) Patent No.: US 12,708,028 B2
(45) Date of Patent: Aug. 11, 2026

(54) SEMICONDUCTOR MODULE WITH MELTABLE ENCAPSULANT ZONES

(71) Applicant: Infineon Technologies AG, Neubiberg (DE)

(72) Inventors: Anita Herzer, Kaiserslautern (DE); Markus Wiesemann, Bielefeld (DE)

(73) Assignee: Infineon Technologies AG, Neubiberg (DE)

( * ) Notice: Subject to any disclaimer, the term of this patent is extended or adjusted under 35 U.S.C. 154(b) by 492 days.

(21) Appl. No.: 18/203,954

(22) Filed: May 31, 2023

(65) Prior Publication Data

US 2024/0404903 A1 Dec. 5, 2024

(51) Int. Cl.

*H10W 70/65* (2026.01)
*H10W 74/10* (2026.01)
*H10W 74/47* (2026.01)
*H10W 90/00* (2026.01)

(52) U.S. Cl.

CPC ......... *H10W 74/121* (2026.01); *H10W 70/65* (2026.01); *H10W 74/476* (2026.01); *H10W 90/00* (2026.01); *H10W 90/753* (2026.01)

(58) Field of Classification Search

CPC ............... H01L 23/3135; H01L 23/296; H01L 23/49838; H01L 24/48; H01L 25/072; H01L 2224/48137; H01L 2924/13055; H01L 2924/13064; H01L 2924/13091; H01L 23/293; H01L 23/562; H01L 24/85; H01L 2224/8592; H01L 23/24; H01L 23/22; H01L 23/10

See application file for complete search history.

(56) References Cited

U.S. PATENT DOCUMENTS

2012/0074596 A1 3/2012 Sumita et al.
2016/0005671 A1 1/2016 Tsuyuno et al.
2016/0111345 A1* 4/2016 Kawase .............. H01L 23/3675 257/706

* cited by examiner

*Primary Examiner* — Elias Ullah
(74) *Attorney, Agent, or Firm* — Murphy, Bilak & Homiller, PLLC

(57) ABSTRACT

A semiconductor module includes a power electronics carrier including a metallization layer disposed on an electrically insulating substrate, a power semiconductor die mounted on the power electronics carrier, a housing that surrounds an interior volume over the power electronics carrier, an electrically insulating encapsulant within the interior volume that encapsulates the power semiconductor die, wherein the electrically insulating encapsulant is configured to transform during operation of the power semiconductor die such that a liquified envelope of the electrically insulating encapsulant surrounds the power semiconductor die and such that a solid outer region of the electrically insulating encapsulant surrounds the liquified envelope.

18 Claims, 3 Drawing Sheets

SEMICONDUCTOR MODULE WITH MELTABLE ENCAPSULANT ZONES

BACKGROUND

Many different applications such as automotive and industrial applications utilize power modules. Power modules may include multiple power devices in a single package, with these power devices being arranged as a power conversion circuit, e.g., a single and multi-phase half-wave rectifier, single and multi-phase full-wave rectifier, voltage regulator, inverter, etc. Power modules can be subjected to harsh environmental conditions, e.g., substantial temperature variations, moisture, etc. Moreover, the power electronic circuitry within the power module including the semiconductor dies and associated passive elements generates a substantial amount of heat during operation. This creates challenges in providing an encapsulant that protects and electrically insulates the power electronic circuitry within the power module.

SUMMARY

A semiconductor module is disclosed. According to an embodiment, the semiconductor module comprises a power electronics carrier comprising a metallization layer disposed on an electrically insulating substrate, a power semiconductor die mounted on the power electronics carrier, a housing that surrounds an interior volume over the power electronics carrier, and an electrically insulating encapsulant within the interior volume that encapsulates the power semiconductor die, wherein the electrically insulating encapsulant is a solid at room temperature, and wherein the electrically insulating encapsulant is configured to liquify without curing in response to heat generated by the power semiconductor die during operation.

According to another embodiment, the semiconductor module comprises a power electronics carrier comprising a metallization layer disposed on an electrically insulating substrate, a power semiconductor die mounted on the power electronics carrier, a housing that surrounds an interior volume over the power electronics carrier, an electrically insulating encapsulant within the interior volume that encapsulates the power semiconductor die, wherein the electrically insulating encapsulant is configured to transform during operation of the power semiconductor die such that a liquified envelope of the electrically insulating encapsulant surrounds the power semiconductor die and such that a solid outer region of the electrically insulating encapsulant surrounds the liquified envelope.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a semiconductor module having an encapsulant with advantageous thermomechanical characteristics are disclosed herein. The encapsulant is a solid at room temperature and is configured to liquify in response to operational heat generated by the devices it encapsulates, thereby forming liquified envelopes of encapsulant around each heat generating element. The liquid state of the encapsulant advantageously mitigates the problem of cracks and delamination that may arise from CTE (coefficient of thermal expansion) mismatch of the elements. Moreover, the liquified envelopes of the encapsulant are advantageously self-sealed by the surrounding electrically insulating encapsulant that is sufficiently distant from the heat generating elements to remain solid. This prevents the liquified encapsulant from leaking out of the housing.

Figure 1:
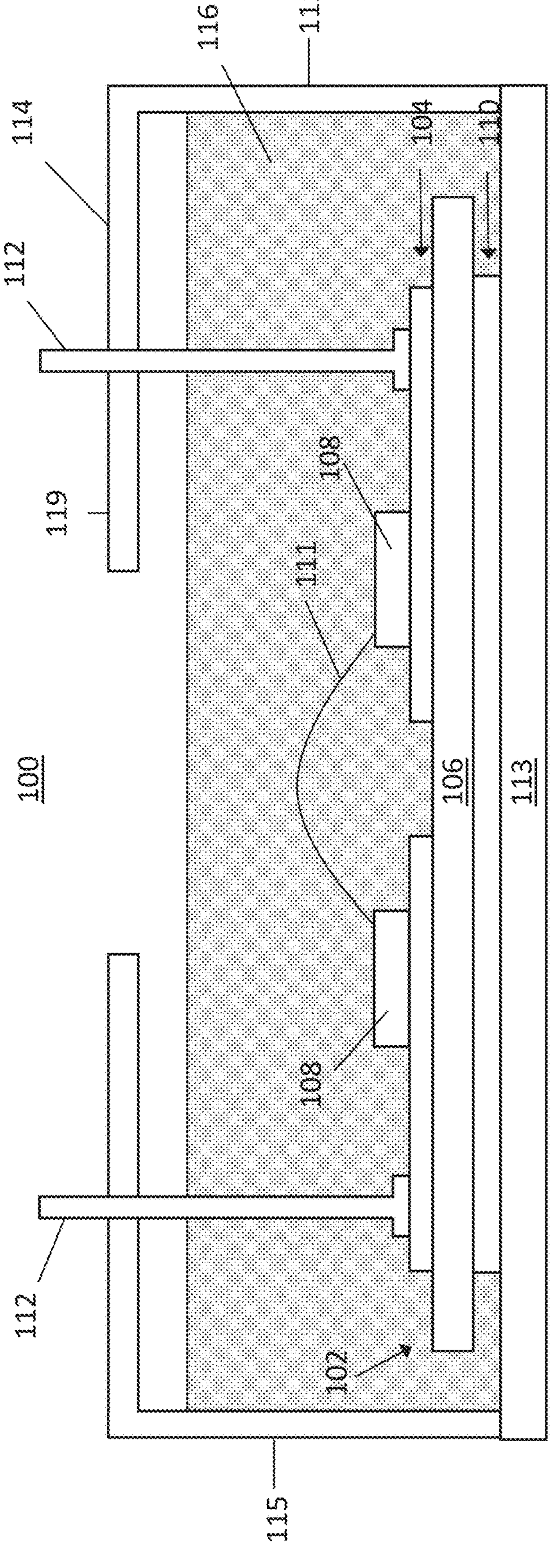
FIG. 1 illustrates a semiconductor module wherein the electrically insulating encapsulant is in a solid state, according to an embodiment.

Referring to FIG. 1, a semiconductor module 100 is depicted, according to an embodiment. The semiconductor module 100 comprises a carrier 102. The carrier 102 is a substrate that is configured to accommodate the mounting of multiple power semiconductor devices thereon and to efficiently extract heat away from these power semiconductor devices during operation. According to an embodiment, the carrier 102 comprises a structured metallization layer 104 disposed on an electrically insulating substrate 106. The structured metallization layer 104 comprises a plurality of pads that are disposed on the electrically insulating substrate 106 and are electrically isolated from one another. The pads are dimensioned to accommodate the mounting of semiconductor dies 108 or passive elements thereon. Additionally, the pads can form part of an electrical interconnect structure that connects two or more devices together. The carrier 102 may additionally comprise a second metallization layer 110 disposed on a rear side of the carrier 102. The second metallization layer 110 may be a continuous layer that is used to thermally couple the semiconductor module 100 to a cooling apparatus, such as a heat sink.

According to an embodiment, the carrier 102 is a power electronics carrier, such as a Direct Copper Bonding (DCB) substrate, a Direct Aluminum Bonding (DAB) substrate, an Active Metal Brazing (AMB) substrate, or an Insulated Metal Substrate (IMS). In the case of a DCB substrate, DAB substrate, or AMB substrate. In that case, the electrically insulating substrate 106 may comprise a ceramic material such as $Al_2O_3$ (Alumina) AlN (Aluminium Nitride), etc. In the case of an IMS substrate, the electrically insulating substrate 106 may comprise filled materials such as epoxy resin or polyimide. The carrier 102 may also be a printed circuit board (PCB). In that case, the electrically insulating substrate 106 may comprise a resin material such as FR-4. In any of the above cases, the structured metallization layer 104 and the second metallization layer 110 may comprise or be plated with any or more of Cu, Ni, Ag, Au, Pd, Pt, NiV, NiP, NiNiP, NiP/Pd, Ni/Au, NiP/Pd/Au, or NiP/Pd/AuAg.

The semiconductor module 100 comprises semiconductor dies 108 mounted on the carrier 102. According to an embodiment, at least one of semiconductor dies 108 is a power semiconductor die. A power semiconductor die refers to a device that is rated to accommodate voltages of at least 100 V (volts) and may be on the order of 600 V, 1200 V or more and/or is rated to accommodate currents of at least 1 A and may be on the order of 10 A, 50 A, 100 A or more. Examples of power semiconductor dies include discrete power transistors, e.g., MOSFETs (Metal Oxide Semiconductor Field Effect Transistors), IGBTs (Insulated Gate Bipolar Transistors), and HEMTs (High Electron Mobility Transistors), etc. Separately or in combination, the semiconductor dies 108 mounted on the carrier 102 may include other types of devices, e.g., logic devices, custom circuits, controllers, sensing devices, passive elements, etc.

The semiconductor module 100 may be configured as a power converter or power inverter. For example, the semiconductor dies 108 may be power transistors that form the high-side switch and low-side switch of a half-bridge circuit. The power module may additionally comprise driver dies that control a switching operation of the half-bridge circuit. The power module may additionally include passive devices, e.g., capacitors, inductors, resistors, etc. The semiconductor module 100 may include one or more electrical interconnect elements to form electrical interconnection with the semiconductor dies 108 or other components mounted on the carrier 102. As shown, the semiconductor module 100 comprises a bond wire 111 connecting two of the semiconductor dies 108 together. The semiconductor module 100 may additionally or alternatively comprise other types of electrical interconnect elements such as metal clips or ribbons. Additionally, the semiconductor module 100 may comprise additional metal structures, such as tabs or busbar structures (not shown) that deliver fixed voltages to the various devices mounted on the on the carrier 102.

The semiconductor module 100 comprises a housing 114 that surrounds an interior volume over the carrier 102. In this context, the interior volume refers to a three-dimensional space that is disposed over and around the enclosed surfaces of the carrier 102. In certain configurations, the housing may also surround a volume that is below portions of the carrier 102. Thus, the housing 114 in combination with the carrier 102 define a three-dimensional space. The housing 114 comprises outer sidewalls 115 and may comprise a roof section 119 that partially or completely encloses the interior volume. In other embodiments, the housing 114 may work in combination with a lid structure that is placed on the housing to enclose an interior volume.

The semiconductor module 100 comprises terminal connectors 112 extending from the carrier 102 to a location that is externally accessible outside of the interior volume that is enclosed by the housing 114. The terminal connectors 112 may be formed from an electrically conductive metal, e.g., copper, aluminum, nickel, alloys thereof. The terminal connectors 112 may be attached to the structured metallization layer 104 and/or to other electronic components inside the module 100 by a conductive adhesive, e.g., solder, sinter, conductive glue, etc. The terminal connectors 112 may be adapted to mate with a particular receptacle, e.g., a PCB. The terminal connectors 112 may have a variety of geometric configurations, including press-fit or spring-loaded contact mechanisms.

In the depicted embodiment, the semiconductor module 100 comprises a metal baseplate 113 that forms a floor section of the semiconductor module 100. The metal baseplate 113 may be a planar structure that comprises, e.g., copper, aluminium, and alloys thereof. The housing 114 may be secured to the metal baseplate 113, e.g., by an electronics adhesive. The carrier 102 may be secured to the metal baseplate 113, e.g., by an electronics adhesive or a solder, sinter, etc. In other embodiments of the semiconductor module 100, the metal baseplate 113 may be omitted such that the carrier 102 forms the floor section of the semiconductor module 100. In that case, the housing 114 may be secured directly to an upper side of the carrier 102, e.g., by an electronics adhesive.

The semiconductor module 100 comprises an electrically insulating encapsulant 116 that fills the interior volume and encapsulates the semiconductor dies 108. The encapsulant 116 is an electrically insulating material. For example, the encapsulant 116 may have a dielectric strength of at least 10 kV/mm and/or a a specific resistance of at least $2*10^{13}$ Ω·cm. The encapsulant 116 encapsulates, i.e., surrounds and protects, each of the elements contained within the interior volume, including the semiconductor dies 108. In this way, the encapsulant 116 protects these elements from harmful environmental conditions such as dust and moisture and electrically insulates conducting elements with different electrical potentials. According to an embodiment, the electrically insulating encapsulant 116 is in a solid state at room temperature (20° C.). As used herein, the term solid refers to a state of matter that has a fixed volume and shape. In the context of polymer based encapsulant materials, a solid-state material may be a viscoelastic material or viscous material with a dynamic viscosity exceeding 3000 Pa·s.

In the embodiment of FIG. 1, the electrically insulating encapsulant 116 is in the solid state throughout a complete volume of the material. The electrically insulating encapsulant 116 may have this property when the semiconductor module 100 is in a non-operational state, i.e., a condition wherein the semiconductor dies 108 are non-operational. In the non-operational state, the semiconductor module 100 may be exposed to an ambient environment that deviates from room temperature. For instance, in certain applications, the ambient environment may be significantly below room temperature, e.g., temperatures on the order of −25° C., −40° C., −50° C., −55° C. or lower. In these same applications or other applications, the ambient environment may be above room temperature, e.g., temperatures on the order of 30° C., 40° C., 50° C. or more. The electrically insulating encapsulant 116 may be configured to remain as a stable solid within a temperature range that corresponds to the temperatures of the ambient for the intended application. That is, the melting point of the electrically insulating encapsulant 116 may be at least as high as room temperature, and may be higher, e.g., 60° C., 70° C., 80° C., etc., depending on application requirements.

Figure 2:
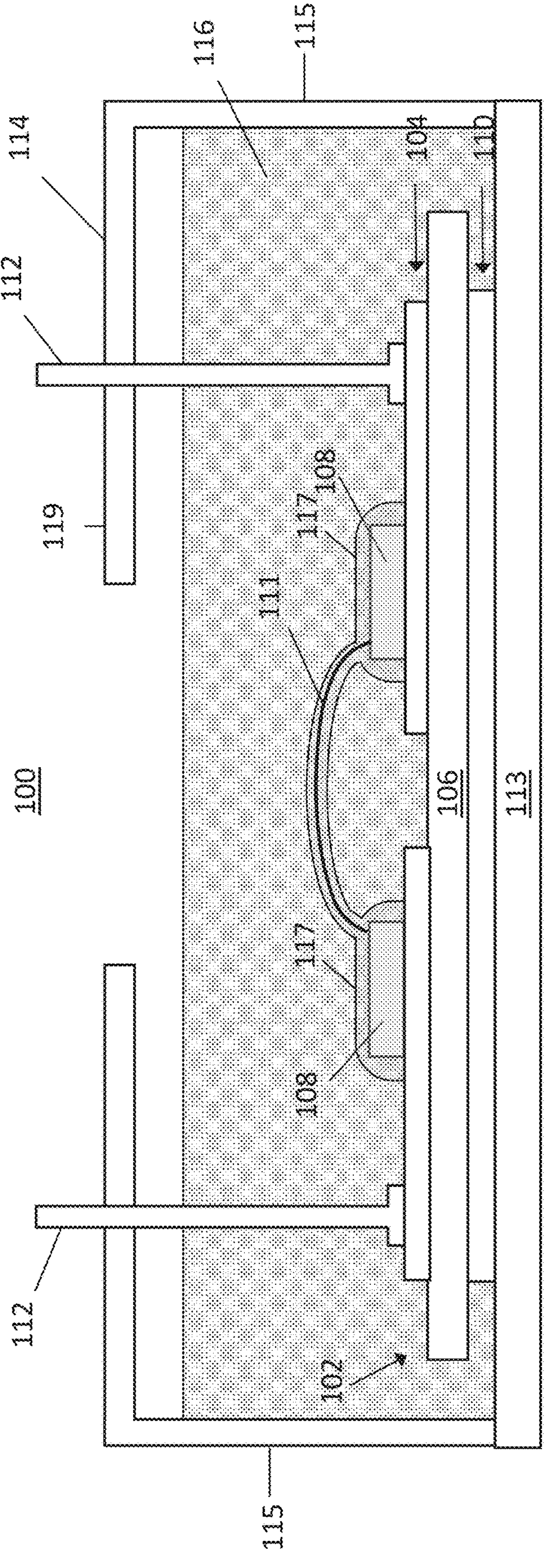
FIG. 2 illustrates a semiconductor module wherein the electrically insulating encapsulant is transformed by operational heat of the semiconductor dies and bond wires to form liquified envelopes of the electrically insulating encapsulant that surround the semiconductor dies, according to an embodiment.

Referring to FIG. 2, the semiconductor module 100 is shown during operation of the semiconductor dies 108. The operation of the semiconductor dies 108 refers to a state whereby a voltage supply is provided across the load terminals of the semiconductor dies 108 and these semiconductor dies 108 perform conduction/blocking, as the case may be. For example, in the case of a half-bridge circuit, the operation of the semiconductor dies 108 comprises providing a power supply voltage of, e.g., 600V, 1200V etc., across the half-bridge circuit, with the control terminals (gate) of the power transistors being switched according to a power delivery scheme such as pulse width modulation. As is generally known, semiconductor devices may generate significant heat during operation due to mechanisms such as Joule heating. Modern power semiconductor devices are designed to conduct a high amount of current, e.g., 10A, 50

A, 75 A or more, within a relatively small die area, e.g., between about 250 $mm^2$, and 50 $mm^2$. The high energy density of these devices results in maximum surface temperatures on the order of 100° C., 150° C., 200° C., 250° C. or more during operation. The maximum surface temperature refers to the highest temperature that occurs at an outer surface of the device. Typically, the maximum surface temperature arises at locations wherein the highest current density occurs. For example, the maximum surface temperature may arise at metal bond pads that are disposed upper surfaces of the semiconductor dies 108 that face away from the carrier 102 and form the load terminals of the device, e.g., source or drain in the case of a MOSFET, collector or emitter in the case of an IGBT, etc., and at the bond wire 111 connecting two of the semiconductor dies 108 together or bond wires connecting the semiconductor device with additional electrically conductive parts, e.g., metallization 102. Outside of the semiconductor dies and bond wires the housing and outer parts of the module will reach temperatures above room temperature e.g. 50° C., 75° C. or more.

In the semiconductor module 100 of FIG. 2, the operation of the semiconductor dies 108 and consequent heat generation locally transforms the electrically insulating encapsulant 116 to form liquified envelopes 117 of the electrically insulating encapsulant 116 surrounding each of the power semiconductor dies 108 and the bond wires 111. The liquified envelopes 117 are localized volumes of the electrically insulating encapsulant 116 that surround the heat generating elements. These localized volumes contain the electrically insulating encapsulant 116 in a liquid state. In this context, a liquid may encompass a material with a dynamic viscosity of between 0.01 Pa·S and 3000 Pa·S. The liquified envelopes 117 may occupy an area that is between 0.5 times and 2.0 times the lateral chip dimension of the semiconductor dies 108 that they envelop, for example. The vertical dimension of the envelope may be 1 mm above the highest point of the bond wires 111. Separately or in combination, the liquified electrically insulating encapsulant 116 may have a vertical extension of less than 10 mm. Meanwhile, a solid outer region of the electrically insulating encapsulant 116 surrounds each of the liquified envelopes 117. That is, the transformation of the electrically insulating encapsulant 116 only occurs locally, with the rest of the electrically insulating encapsulant 116 remaining in a solid state.

The semiconductor module 100 having the liquified envelopes 117 of the electrically insulating encapsulant 116 surrounding the power semiconductor dies 108 has the following advantages. The liquified electrically insulating encapsulant 116 has advantageous characteristics with respect to mechanical stress absorption, delamination, and electrical isolation. In contrast, to solid or quasi-solid encapsulant materials, there is no possibility of cracking or separation of the material due to CTE (coefficient of thermal expansion) mismatch of the materials. This reduces the possibility of potential short circuit paths and/or complete destruction of the semiconductor module 100. Moreover, due to Brownian motion of the liquified encapsulant, there is better heat transfer and the possibility of localized hot-spots is minimized. One major challenge with liquid encapsulant solutions is providing a seal within the module that prevents leakage of the liquid. The solution disclosed herein addresses this issue because the electrically insulating encapsulant 116 forms a self-sealing arrangement whereby the liquified envelope is reliably sealed by the solid outer region of the electrically insulating encapsulant 116. That is, no separate sealing mechanism is needed to ensure that that liquified encapsulant material does not escape from the semiconductor module 100.

In addition to the liquified envelopes 117 surrounding the power semiconductor dies 108 as shown in the depicted embodiments, liquified envelopes 117 of the electrically insulating encapsulant 116 may form around any heat generating elements within the semiconductor module 100, with the consequent benefits of the liquified envelopes 117 as described herein being obtained. Examples of these heat generating elements include electrical interconnect elements, e.g., bond wires, clips, ribbons, etc., and discrete passive components, e.g., inductors, capacitors, etc.

According to an embodiment, the electrically insulating encapsulant 116 is configured to liquify without curing in response to heat generated by the power semiconductor dies 108 during operation. Curing refers to a process that occurs in fluid or gelatinous materials whereby an external stimulus, such as externally applied heat, radiation, chemical reactant, etc., induces a controlled and defined cross-linking reaction that links monomers to create polymer chains and polymer networks. Curing does not include uncontrolled and degrading oxidative aging of materials at elevated temperatures, which typically includes undefined crosslinking reactions. A curing process irreversibly hardens the material, meaning that it remains as a solid after the external stimulus is no longer applied. Typical potting compounds that are used in power semiconductor modules, such as silicone based dielectric gels or epoxy resins, are intentionally designed as thermoset materials, i.e., materials that are cured through the application of heat. These materials are cured at temperatures that may be within a range of temperatures that the encapsulated devices experience during operation. Thus, once the curing is performed, these materials would not liquify in response to heat generated by these devices. By contrast, the electrically insulating encapsulant 116 disclosed herein has no crosslinking reaction and the material parts are solely connected by thermally reversible physical forces. That is, the electrically insulating encapsulant 116 may be melted by the application of heat from the semiconductor dies 108 to form the liquified envelopes 117, and this process may be reversed such that the electrically insulating encapsulant 116 hardens as it cools. Moreover, the process can be repeated multiple times, as the electrically insulating encapsulant 116 is cyclically heated and cooled by the operation of the heat generating elements. As a result, the semiconductor module 100 can create the liquified envelopes 117 over the useful lifetime semiconductor module 100 in response to the operation of the power semiconductor dies 108.

According to an embodiment, the electrically insulating encapsulant 116 is configured such that the melting point of the electrically insulating encapsulant 116 is above room temperature. This maintains the solid state of the electrically insulating encapsulant 116 under typical environmental conditions. As mentioned above, the semiconductor module 100 may be exposed to temperatures above room temperature during operation, and thus the melting point of the electrically insulating encapsulant 116 may be selected such that the electrically insulating encapsulant 116 remains as a solid in these potential environmental temperatures. For example, the electrically insulating encapsulant 116 may have a melting point of at least 60° C., at least 70° C., at least 80° C., etc. Separately or in combination, other measures may be provided within the semiconductor module 100 to prevent the ambient environment from liquifying the electrically insulating encapsulant 116 and ensure that only heat generated from the heat generating elements causes this transformation. For example, the semiconductor module 100 may comprise exterior insulation around the electrically insulating encapsulant 116 and/or may comprise active cooling mechanisms around the electrically insulating encapsulant 116.

According to an embodiment, the electrically insulating encapsulant 116 is configured to liquify without curing within a temperature range that is at least as high as a maximum surface temperature of the power semiconductor dies 108 during operation. That is, the properties of the electrically insulating encapsulant 116 are specific to the devices to which they encapsulate. This configuration ensures that the electrically insulating encapsulant 116 is configured to form the liquified envelopes 117 and advantages flowing therefrom repeatedly over a lifetime cycle of the semiconductor module 100. As mentioned above, the maximum surface temperature of the power semiconductor dies 108 during operation may be least 50° C., at least 100° C., at least 200° C., etc. Thus, the electrically insulating encapsulant 116 is configured to liquify without curing at maximum temperatures of at least 50° C., at least 100° C., at least 150° C., at least 200 C°. In one particular embodiment, the electrically insulating encapsulant 116 is configured to liquify without curing within a temperature range that is above room temperature and is no greater than 250° C. In the case of multiple heat generating elements, the temperature range that the electrically insulating encapsulant 116 is configured to liquify without curing can be at least as high as the highest possible temperature value from each of the heat generating elements within the semiconductor module 100. In dependency on the distance to heating elements and potential external cooling elements, the temperature within the encapsulant 116 is heterogenous. Typically, areas with higher distances to heating elements or nearer cooling elements possess the lowest temperatures within the encapsulant 116. The maximum temperature of the edge of encapsulant 116 next to housing 114 or the upper boundary during operation may be at least 60° C., at least 80° C., at least 150° C., etc. Thus, the electrically insulating encapsulant 116 may be configured to stay in the solid state and the lower end of the liquification range may not be less than 60° C., not be less than 80° C., not be less than 150° C., etc. Thus, the encapsulant 116 does not completely liquify without curing and forms closed envelopes surrounded by solid encapsulant 116. Between the heat generating elements and outer areas of the encapsulant 116 next to housing 114 or the upper boundaries a falling temperature profile depending on module design, current flow and cooling power is established. Thus, the temperature in every area within the encapsulant 116 is between the temperatures of hottest heating element and the lowest temperature of encapsulant 116. In order to define the spatial expansion of the envelopes 117, the melting point of the encapsulant 116 is carefully designed to be in between the upper and lower temperature limit defined by the temperature of hottest heating element and outer temperature of the encapsulant 116. Melting ranges of the encapsulant 116 closer to the upper limit will result in envelopes with smaller spatial expansion while melting ranges of the encapsulant 116 closer to the lower limit will result in envelopes with larger spatial expansion.

According to an embodiment, the solid parts of the electrically insulating encapsulant 116 covers the liquified envelopes 117 thereby forming a seal. Melting and heating of the encapsulant 116 will result in the thermal expansion of the material. In order to seal the liquid inside the envelopes 116, the solid encapsulant 116 must fulfill one of following requirements. Either the encapsulant 116 must be rigid enough and sufficiently connected to the other module parts to withstand the inner pressure caused by thermal expansion next to heat generating elements or must possess elastomeric properties in the solid state. Thus, the material is sufficiently flexible such that thermally expanding material will not result in high inner pressures.

An electrically insulating encapsulant 116 that is configured to liquify under the above-described conditions and at temperatures within the operational temperature range of the power module may be created through careful selection of the molecular properties of the material. In particular the electrically insulating encapsulant 116 may include thermoplastics which do not undergo crosslinking reactions at elevated temperatures. Thus, the polymer strains are solely connected by reversible physical forces which allow a reversible melting and hardening during operation and useful module lifetime.

According to an embodiment, the electrically insulating encapsulant 116 comprises a material that is a thermoplastic silicone, which is a solid at room temperature. A thermoplastic silicone refers to filled silicones with very high viscosities so that they are defined as solids at room temperature. It also refers to silicones which are copolymerized with polymers possessing a melting point above room temperature. It also refers to silicones comprising where the polymer chain is chemically designed e.g. by controlled chain length, branch density and substituents to create melting point above room temperature.

According to another embodiment, the electrically insulating encapsulant 116 comprises a thermoplastic elastomer. A thermoplastic elastomer refers to a polymer material with both thermoplastic and elastomeric properties that enable the viscosity of the material to modulate in response to temperature changes. The properties of the thermoplastic elastomer can be selected to have a melting point according to the above-described criteria. Moreover, the properties of the thermoplastic elastomer can be selected by copolymerization where one polymer forms a crystalline domain with strong physical forces defining the melting point of the material and flexible connecting part, which reduce hardness of the material in the solid state. In general, materials like thermoplastic elastomers and thermoplastic silicones which still possess elastomeric properties in the solid state are preferred to rigid thermoplastics, since they reduce mechanical stress of the encapsulant 116 in the solid state and reduce pressure in the liquid envelope caused material expansion.

In each of the above-described embodiments, the electrically insulating encapsulant 116 may include additional additives. For example, the thermoplastic silicone or thermoplastic elastomer may form the matrix material of the electrically insulating encapsulant 116. Optionally, filler particles, e.g., thermally conductive filler particles such as silica, aluminum oxide, aluminum nitride, etc., may be intermixed or suspended within the matrix, Separately or in combination, adhesion promoters may be provided may be intermixed or suspended within the within the matrix. A percentage by weight of the matrix may be in the range of 50% to 99%, with the remaining percentage being filler particles and/or adhesion promoters.

Figure 3:
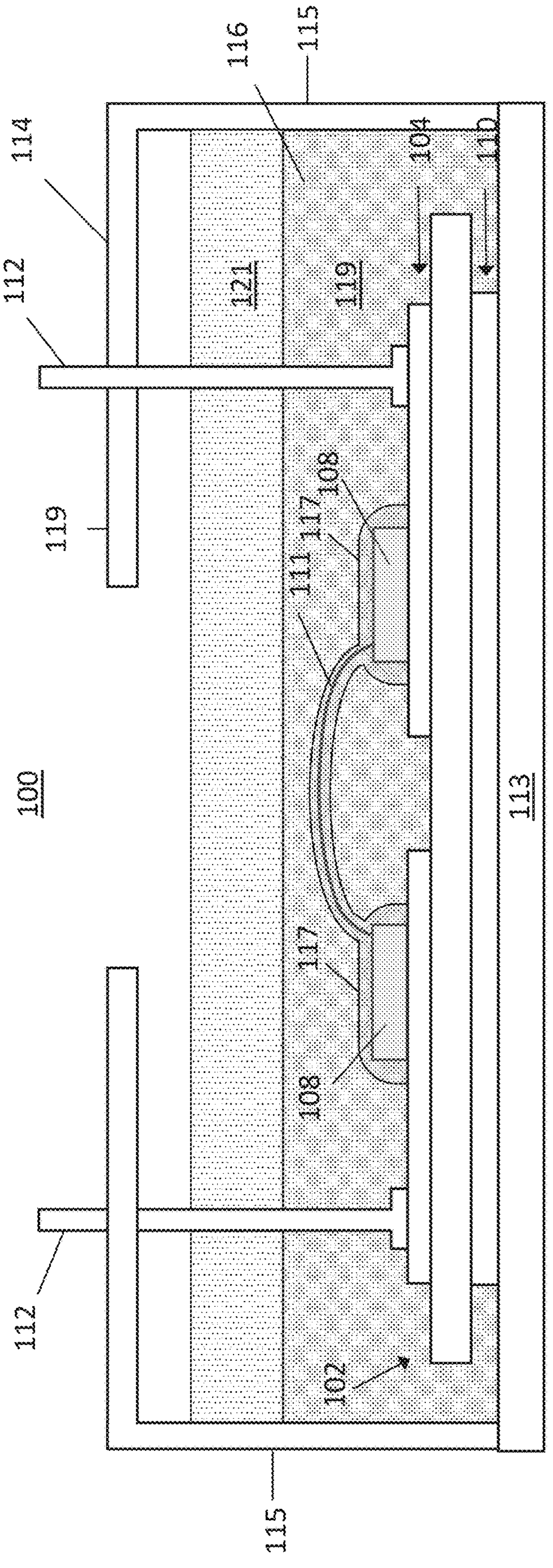
FIG. 3 illustrates a semiconductor module wherein the electrically insulating encapsulant is transformed by operational heat of the semiconductor dies to form liquified envelopes of the electrically insulating encapsulant that surround the semiconductor dies and bond wires, according to another embodiment.

Referring to FIG. 3, the semiconductor module 100 is shown during operation of the semiconductor dies 108, according to another embodiment. This semiconductor module 100 of FIG. 3 differs from the previously described embodiment in that the electrically insulating encapsulant 116 comprises two regions, namely a lower region 119 and an upper region 121. The lower region 119 fills a lower part of the interior volume and encapsulates the semiconductor dies 108. The lower region of the electrically insulating encapsulant 116 comprises encapsulant material that is configured to liquify without curing in response to heat generated by the power semiconductor dies 108 during operation as described above. Thus, the liquified envelopes 117 of the electrically insulating encapsulant 116 form during operation. The encapsulant material from the upper region 121 has a different composition as the lower region 119. In this way, at least some of the characteristics of the electrically insulating encapsulant 116 can be bifurcated. For example, the electrically insulating encapsulant 116 from the upper region 121 may have higher viscosity across the operational ranges of the semiconductor module 100, different thermal properties, different dielectric properties, etc. In one example, the encapsulant material from the upper region 121 is configured to form a sealing layer that prevents escape of the electrically insulating encapsulant 116 in the lower region, e.g., in the case of very high temperatures. In another example, the encapsulant material from the upper region is configured to form a thermal barrier that isolates the electrically insulating encapsulant 116 in the lower region 119 from the ambient environment, mitigating the possibility of partial melting. Examples of materials for the upper region 121 include curable silicone gels and thermoset polymer materials.

Although the present disclosure is not so limited, the following numbered examples demonstrate one or more aspects of the disclosure.

Example 1. A semiconductor module, comprising: a power electronics carrier comprising a metallization layer disposed on an electrically insulating substrate, a power semiconductor die mounted on the power electronics carrier, a housing that surrounds an interior volume over the power electronics carrier, and an electrically insulating encapsulant within the interior volume that encapsulates the power semiconductor die, wherein the electrically insulating encapsulant is a solid at room temperature, and wherein the electrically insulating encapsulant is configured to liquify without curing in response to heat generated by the power semiconductor die during operation.

Example 2. The semiconductor module of example 1, wherein the electrically insulating encapsulant is configured to liquify without curing within a temperature range that is above room temperature and at least as high as a maximum surface temperature of the power semiconductor die during operation.

Example 3. The semiconductor module of example 2, wherein the maximum surface temperature of the power semiconductor die during operation is at least 50° C.

Example 4. The semiconductor module of example 2, wherein the maximum surface temperature of the power semiconductor die during operation is at least 100° C.

Example 5. The semiconductor module of example 4, wherein the maximum surface temperature of the power semiconductor die during operation is at least 200° C.

Example 6. The semiconductor module of example 4, wherein the maximum surface temperature of the power semiconductor die during operation is no greater than 250° C.

Example 7. The semiconductor module of example 2, wherein a lower value of the temperature range is at least 40° C.

Example 8. The semiconductor module of example 7, wherein the lower value of the temperature range is at least 60° C.

Example 9. The semiconductor module of example 1, wherein the power semiconductor die is a discrete power device that is rated to block at least 600 V.

Example 10. The semiconductor module of example 1, wherein the electrically insulating encapsulant comprises a rigid thermoplastic that is configured to adhere to all parts within the semiconductor module and to withstand an inner pressure of a liquified envelope of the electrically insulating encapsulant caused by thermal expansion.

Example 11. The semiconductor module of example 1, wherein the electrically insulating encapsulant comprises a thermoplastic wax with a melting range that is above 60° C.

Example 12. The semiconductor module of example 1, wherein the electrically insulating encapsulant comprises a thermoplastic silicone that is solid at room temperature.

Example 13. The semiconductor module of example 1, wherein the electrically insulating encapsulant comprises a thermoplastic elastomer.

Example 14. A semiconductor module, comprising: a power electronics carrier comprising a metallization layer disposed on an electrically insulating substrate; a power semiconductor die mounted on the power electronics carrier; a housing that surrounds an interior volume over the power electronics carrier; an electrically insulating encapsulant within the interior volume that encapsulates the power semiconductor die, wherein the electrically insulating encapsulant is configured to transform during operation of the power semiconductor die such that a liquified envelope of the electrically insulating encapsulant surrounds the power semiconductor die and such that a solid outer region of the electrically insulating encapsulant surrounds the liquified envelope.

Example 15. The semiconductor module of example 14, wherein the electrically insulating encapsulant is configured to form the liquified envelope by a reversable melting process.

Example 16. The semiconductor module of example 15, wherein a maximum surface temperature of the power semiconductor die during operation is at least 100° C.

Example 17. The semiconductor module of example 16, wherein the maximum surface temperature of the power semiconductor die during operation no greater than 250° C.

Example 18. The semiconductor module of example 14, further comprising a second power semiconductor die mounted on the power electronics carrier that is encapsulated by the electrically insulating encapsulant, and wherein the electrically insulating encapsulant is configured to transform during operation of the second power semiconductor die such that a second liquified envelope of the electrically insulating encapsulant encapsulates the second power semiconductor die and such that the solid outer region of the electrically insulating encapsulant surrounds the second liquified envelope.

The semiconductor dies disclosed herein can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The semiconductor dies disclosed herein may be configured as a vertical device, which refers to a device that conducts a load current between opposite facing main and rear surfaces of the die. Alternatively, the semiconductor dies 108 may be configured as a lateral device, which refers to a device that conducts a load current parallel to a main surface of the die.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor module, comprising:

a power electronics carrier comprising a metallization layer disposed on an electrically insulating substrate;

a power semiconductor die mounted on the power electronics carrier;

a housing that surrounds an interior volume over the power electronics carrier; and an electrically insulating encapsulant within the interior volume that encapsulates the power semiconductor die, wherein the electrically insulating encapsulant is a solid at room temperature, and wherein the electrically insulating encapsulant is configured to liquify without curing in response to heat generated by the power semiconductor die during operation.

2. The semiconductor module of claim 1, wherein the electrically insulating encapsulant is configured to liquify without curing within a temperature range that is above room temperature and at least as high as a maximum surface temperature of the power semiconductor die during operation.

3. The semiconductor module of claim 2, wherein the maximum surface temperature of the power semiconductor die during operation is at least 50° C.

4. The semiconductor module of claim 2, wherein the maximum surface temperature of the power semiconductor die during operation is at least 100° C.

5. The semiconductor module of claim 4, wherein the maximum surface temperature of the power semiconductor die during operation is at least 200° C.

6. The semiconductor module of claim 4, wherein the maximum surface temperature of the power semiconductor die during operation is no greater than 250° C.

7. The semiconductor module of claim 2, wherein a lower value of the temperature range is at least 40° C.

8. The semiconductor module of claim 7, wherein the lower value of the temperature range is at least 60° C.

9. The semiconductor module of claim 1, wherein the power semiconductor die is a discrete power device that is rated to block at least 600 V.

10. The semiconductor module of claim 1, wherein the electrically insulating encapsulant comprises a rigid thermoplastic that is configured to adhere to all parts within the semiconductor module and to withstand an inner pressure of a liquified envelope of the electrically insulating encapsulant caused by thermal expansion.

11. The semiconductor module of claim 1, wherein the electrically insulating encapsulant comprises a thermoplastic wax with a melting range that is above 60° C.

12. The semiconductor module of claim 1, wherein the electrically insulating encapsulant comprises a thermoplastic silicone that is solid at room temperature.

13. The semiconductor module of claim 1, wherein the electrically insulating encapsulant comprises a thermoplastic elastomer.

14. A semiconductor module, comprising:

a power electronics carrier comprising a metallization layer disposed on an electrically insulating substrate;

a power semiconductor die mounted on the power electronics carrier;

a housing that surrounds an interior volume over the power electronics carrier; and an electrically insulating encapsulant within the interior volume that encapsulates the power semiconductor die, wherein the electrically insulating encapsulant is configured to transform during operation of the power semiconductor die such that a liquified envelope of the electrically insulating encapsulant surrounds the power semiconductor die and such that a solid outer region of the electrically insulating encapsulant surrounds the liquified envelope.

15. The semiconductor module of claim 14, wherein the electrically insulating encapsulant is configured to form the liquified envelope by a reversable melting process.

16. The semiconductor module of claim 15, wherein a maximum surface temperature of the power semiconductor die during operation is at least 100° C.

17. The semiconductor module of claim 16, wherein the maximum surface temperature of the power semiconductor die during operation no greater than 250° C.

18. The semiconductor module of claim 14, further comprising a second power semiconductor die mounted on the power electronics carrier that is encapsulated by the electrically insulating encapsulant, and wherein the electrically insulating encapsulant is configured to transform during operation of the second power semiconductor die such that a second liquified envelope of the electrically insulating encapsulant encapsulates the second power semiconductor die and such that the solid outer region of the electrically insulating encapsulant surrounds the second liquified envelope.

* * * * *